US012566378B2

(12) United States Patent
Lee et al.

(10) Patent No.: US 12,566,378 B2
(45) Date of Patent: Mar. 3, 2026

(54) APPARATUS FOR TREATING SUBSTRATE INCLUDING FIRST SUBSTRATE TREATING APPARATUS AND TRANSFER SYSTEM

(71) Applicant: SEMES CO., LTD., Cheonan-si (KR)

(72) Inventors: Sung-Gyu Lee, Cheonan-si (KR); Jung-Hyun Lee, Cheonan-si (KR); Hye Bin Baek, Incheon (KR); Dae Woon Lee, Cheonan-si (KR); Dongwoon Park, Seoul (KR)

(73) Assignee: Semes Co., LTD., Cheonan-si (KR)

( * ) Notice: Subject to any disclaimer, the term of this patent is extended or adjusted under 35 U.S.C. 154(b) by 765 days.

(21) Appl. No.: 17/885,865

(22) Filed: Aug. 11, 2022

(65) Prior Publication Data

US 2023/0051256 A1 Feb. 16, 2023

(30) Foreign Application Priority Data

Aug. 12, 2021 (KR) ........................ 10-2021-0106786

(51) Int. Cl.
*G03F 7/16* (2006.01)
*H01L 21/02* (2006.01)
*H01L 21/67* (2006.01)

(52) U.S. Cl.
CPC .............. *G03F 7/162* (2013.01); *G03F 7/168* (2013.01); *H01L 21/02087* (2013.01); *H01L 21/6715* (2013.01); *H01L 21/67178* (2013.01)

(58) Field of Classification Search
None
See application file for complete search history.

(56) References Cited

U.S. PATENT DOCUMENTS

2008/0092929 A1* 4/2008 Yokouchi .......... H01L 21/67051
134/30
2008/0142043 A1* 6/2008 Yamamoto ........ H01L 21/67051
134/95.1
2011/0308549 A1* 12/2011 Minami ............ H01L 21/67051
134/26

(Continued)

FOREIGN PATENT DOCUMENTS

JP H10-309509 A 11/1998
JP H11-147066 A 6/1999

(Continued)

OTHER PUBLICATIONS

Office Action for Korean Application No. 10-2021-0106796 dated Mar. 27, 2022.

(Continued)

*Primary Examiner* — Binu Thomas
(74) *Attorney, Agent, or Firm* — Harness, Dickey & Pierce, P.L.C.

(57) ABSTRACT

Disclosed is an apparatus for treating a substrate, which includes: a first unit configured to perform a coating process of forming a film on a substrate; a transfer unit including a transfer robot transferring a substrate for which the coating process is terminated; and a controller controlling the first unit and the transfer unit, in which the controller controls the substrate for which the coating process is terminated in the first unit to rotate at a first rotational velocity until the substrate is transferred by the transfer unit.

9 Claims, 11 Drawing Sheets

(56) References Cited

U.S. PATENT DOCUMENTS

| | | | | |
|---|---|---|---|---|
| 2012/0189773 A1* | 7/2012 | Tachibana | ........... | H01L 21/6715 |
| | | | | 118/696 |
| 2014/0272704 A1 | 9/2014 | Chang et al. | | |
| 2017/0056917 A1* | 3/2017 | Imamura | ............. | H01L 21/6715 |
| 2018/0061649 A1* | 3/2018 | Park | .................... | H01L 21/6715 |
| 2018/0211832 A1* | 7/2018 | Hasimoto | ......... | H01L 21/67051 |
| 2019/0096706 A1* | 3/2019 | Kai | ................... | H01L 21/67051 |

FOREIGN PATENT DOCUMENTS

| | | | |
|---|---|---|---|
| JP | 2011-233907 | A | 11/2011 |
| JP | 2012-038968 | A | 2/2012 |
| KR | 10-0578612 | | 11/2006 |
| KR | 101676066 | B1 | 11/2016 |

OTHER PUBLICATIONS

Japanese Office Action, dated Jun. 27, 2023, issued in corresponding Japanese Patent Application No. 2022-126225.

* cited by examiner

FIG. 3

APPARATUS FOR TREATING SUBSTRATE INCLUDING FIRST SUBSTRATE TREATING APPARATUS AND TRANSFER SYSTEM

CROSS-REFERENCE TO RELATED APPLICATIONS

This application claims priority to and the benefit of the Korean Patent Application No. 10-2021-0106786 filed in the Korean Intellectual Property Office on Aug. 12, 2021, the entire contents of which are incorporated herein by reference.

TECHNICAL FIELD

The exemplary embodiment relates to an apparatus for treating a substrate and a method for treating a substrate.

BACKGROUND ART

In order to manufacture a semiconductor device, various processes such as cleaning, deposition, photolithography, etching, and ion implantation are performed. Among the processes, the lithography process includes a coating process of forming a film by coating a photosensitive liquid such as a photoresist onto a surface of a substrate, an exposure process of transferring a circuit pattern onto a film formed on the substrate, and a developing process of selectively removing the film formed on the substrate in an exposure-treated region or an opposite region thereto.

In general, a plurality of treating chambers is disposed on one layer of a substrate treating facility, and one transfer robot transfers the substrate among the plurality of treating chambers. When a treating process for the substrate is terminated simultaneously or at a minute interval in the plurality of treating chambers, the substrate should be transferred to a subsequent chamber by one transfer robot, so there is a case where some substrates of which treating is terminated should wait in the treating chamber. In this case, the substrate generally waits in a stop state.

A descending air flow is supplied to an inside of the treating chamber, and there is a case where the descending air flow is supplied into the treating chamber while is not uniform due to a processing error, a vortex, etc. In this case, when the substrate waits in the stop state in the treating chamber, there is an evaporation rate difference of a treating liquid for each position of the substrate due to the non-uniform descending air flow. That is, an evaporation rate of the treating liquid coated to an area of the substrate to which a strong air flow is supplied is large and the evaporation rate of the treating liquid coated on an area of the substrate to which a relatively weak air flow is supplied. In this case, there is a problem in that thickness uniformity of the treating liquid coated on the substrate is lowered due to the evaporation rate difference. Further, there is a problem in that the lowering of the thickness uniformity of the treating liquid causes a non-uniform critical dimension of CD of a pattern.

SUMMARY OF THE INVENTION

The present invention has been made in an effort to provide an apparatus for treating a substrate and a method for treating a substrate which may suppress a difference in evaporation rate of a treating liquid for each position of a substrate.

The present invention has also been made in an effort to provide an apparatus for treating a substrate and a method for treating a substrate which may effectively enhance a thickness uniformity of a liquid film applied on the substrate.

Further, the present invention has also been made in an effort to provide an apparatus for treating a substrate and a method for treating a substrate which may effectively enhance critical dimension (CD) precision of a pattern formed on the substrate.

The object to be achieved by the present invention is not limited to the aforementioned object, and other objects, which are not mentioned above, will be apparent to a person having ordinary skill in the art from the following description.

An exemplary embodiment of the present invention provides an apparatus for treating a substrate.

The apparatus for treating a substrate includes: a first unit configured to perform a coating process of forming a film on a substrate; a transfer unit including a transfer robot transferring a substrate for which the coating process is terminated; and a controller controlling the first unit and the transfer unit, and the controller controls the substrate for which the coating process is terminated in the first unit to rotate at a first rotational velocity until the substrate is transferred by the transfer unit.

The coating process may include a liquid supply step of forming the film on the substrate by supplying a first liquid to the rotating substrate, and an edge bead removal (EBR) step of removing a film of an edge region of the substrate in the film formed on the substrate by supplying a second liquid to the rotating substrate, and the controller may control the substrate to rotate at a second rotational velocity in the liquid supply step and the substrate to rotate at a second rotational velocity in the edge bead removal step.

The controller may control the first rotational velocity to be lower than the third rotational velocity.

The controller may control the third rotational velocity to be lower than the second rotational velocity.

The first rotational velocity may be 10 rpm to 20 rpm.

The controller may control the substrate which rotates at the first rotational velocity to be stopped when the transfer robot is located at a set position.

The first unit may include a process chamber having an inner space in which the coating process is performed, and having a door in which the substrate is carried in and over on one side wall, and the set position may be a position where the transfer robot is positioned in front of the door.

The first liquid may include a photosensitive liquid, and the second liquid may include a thinner.

The first unit may include a process chamber having the inner space, a liquid treating unit provided to the inner space and performing a liquid treating process, and an air flow supply unit disposed above the process chamber and providing a descending air flow to the inner space, and the liquid treating unit may include a housing, a treating container provided into the housing, and having a treating space treating the substrate, a support unit supporting and rotating the substrate in the treating space, and a liquid supply unit supplying a treating liquid to the substrate supported on the support unit.

The apparatus may further include a second unit performing a heat treating process for the substrate, and the transfer unit may transfer the substrate between the first unit and the second unit.

Another exemplary embodiment of the present invention provides a method for treating a substrate.

The method for treating a substrate includes: a coating step of perform a coating process of forming a film on a rotating substrate; a transfer step of transferring a substrate for which the coating process is terminated; and a waiting step in which the substrate for which the coating process is terminated between the coating step and the transfer step, and the substrate rotates at a first rotational velocity in the waiting step.

The first rotational velocity may be lower than a velocity of the substrate which rotates in the coating step.

The coating step may include a liquid supply step of forming the film on the substrate by supplying a first liquid to a substrate which rotates at a second rotational velocity, and an edge bead removal (EBR) step of removing a film of an edge region of the substrate in the film formed on the substrate by supplying a second liquid to a substrate which rotates at a third rotational velocity, and the third rotational velocity may be lower than the second rotational velocity, and the first rotational velocity may be lower than the third rotational velocity.

The first rotational velocity may be 10 rpm to 12 rpm.

The first liquid may be a photosensitive liquid, and the second liquid may be a thinner.

The substrate which waits in the waiting step may rotate at the first rotational velocity until the transfer robot is located at a set position, and stop rotation when the transfer robot reaches the set position.

The set position may be a position where the transfer robot is positioned in front of a door of a process chamber in which the coating process is performed.

The method may further include performing a heat treating process in the substrate for which the coating process is terminated, and the transfer robot may transfer the substrate between a first unit performing the coating process and a second unit performing the heat treating process.

Yet another exemplary embodiment of the present invention provides an apparatus for treating a substrate.

The apparatus for treating a substrate includes: a first unit configured to perform a coating process of forming a film on a rotating substrate; a second unit performing a heat treating process for the substrate; a transfer unit including a transfer robot transferring the substrate between the first unit and the second unit; and a controller controlling the first unit, the second unit, and the transfer unit, and the controller controls the substrate for which the coating process is terminated in the first unit to rotate the substrate at a first rotational velocity until the substrate is transferred by the transfer unit, and controls the substrate to rotate the first rotational velocity until the transfer robot is located at a set position.

The coating process may include a liquid supply step of forming the film on the substrate by supplying a photosensitive liquid to a substrate which rotates at a second rotational velocity, and an edge bead removal (EBR) step of removing a film of an edge region of the substrate in the film formed on the substrate by supplying a thinner to a substrate which rotates at a third rotational velocity, and the controller may control the first rotational velocity to be lower than the third rotational velocity, and the third rotational velocity to be lower than the second rotational velocity, and the set position may be a position where the transfer robot is positioned in front of a door of a process chamber in which the coating process is performed.

According to an exemplary embodiment of the present invention, an apparatus for treating a substrate and a method for treating a substrate can be provided which may suppress a difference in evaporation rate of a treating liquid for each position of a substrate.

Further, according to an exemplary embodiment of the present invention, a thickness uniformity of a liquid film applied onto the substrate can be enhanced.

Further, according to an exemplary embodiment of the present invention, critical dimension (CD) precision of a pattern formed on the substrate can be enhanced.

An effect of the present invention is not limited to the above-described effects, and effects which are not mentioned can be apparently appreciated by those skilled in the art which belongs to the present invention from this specification and the accompanying drawings.

BRIEF DESCRIPTION OF THE DRAWINGS

FIG. 3 is a plan view of the apparatus for treating a substrate in FIG. 1.

DETAILED DESCRIPTION

Figure 1:
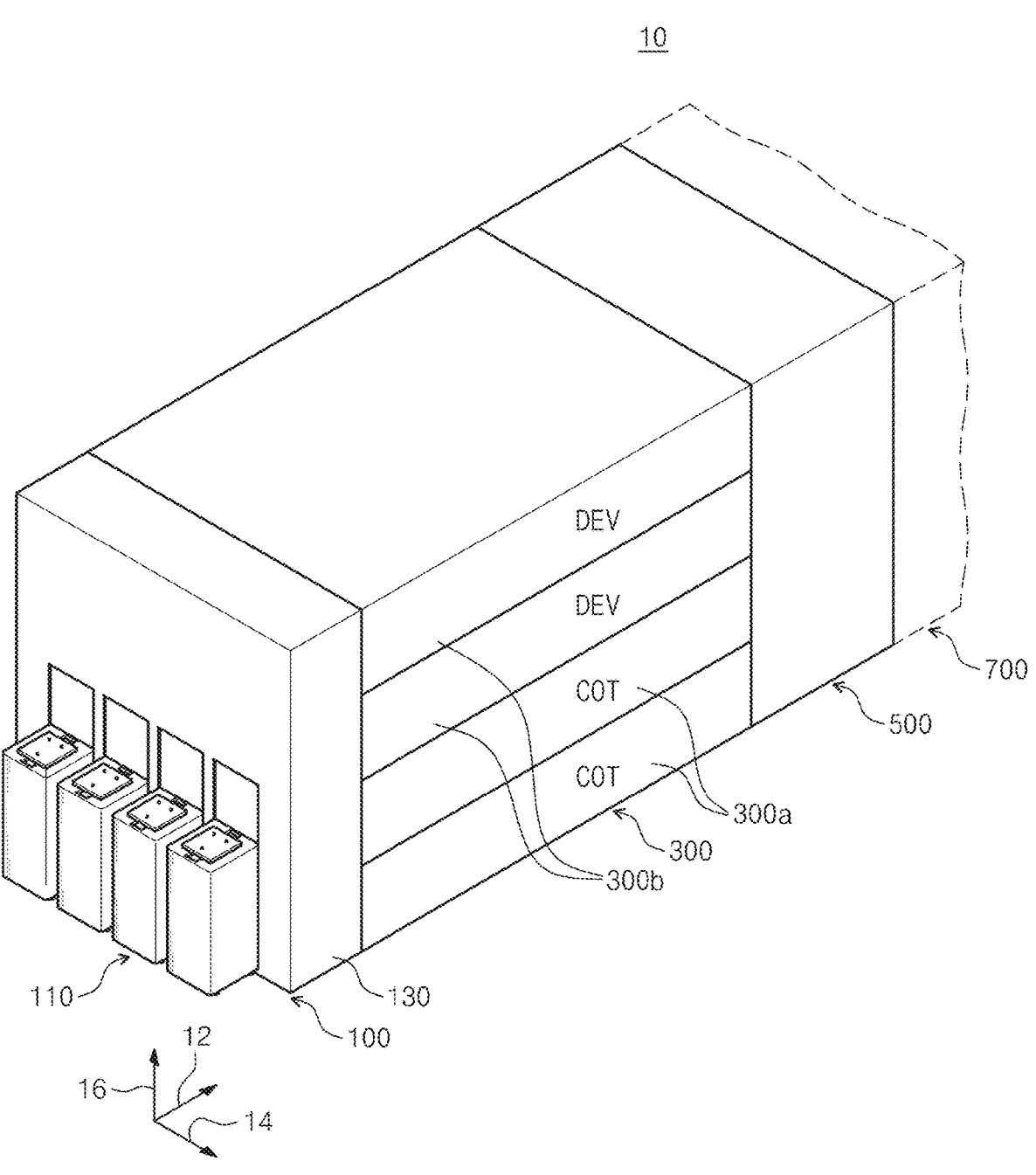
FIG. 1 is a perspective view schematically illustrating an apparatus for treating a substrate according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Further, in describing the exemplary embodiment of the present invention, detailed description of associated known function or constitutions will be omitted if it is determined that they unnecessarily make the gist of the present invention unclear. Further, the same reference numeral is used for a part which performs a similar function and a similar action through all drawings.

Unless explicitly described to the contrary, the word "comprise" and variations such as "comprises" or "comprising", will be understood to imply the inclusion of stated elements but not the exclusion of any other elements. Specifically, it should be understood that the term "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance.

A singular form includes a plural form if there is no clearly opposite meaning in the context. Further, shapes, sizes, and the like of elements in the drawings may be exaggerated for clearer explanation.

The term "and/or" includes any one of the corresponding listed items and all combinations of one or more items. Further, in this specification, the term "connected" means a case where member C is interposed between member A and member B to indirectly connect member A and member B in addition to a case where member A and member B are directly connected.

The embodiment of the present invention can be modified in various forms, and it should not be construed that the scope of the present invention is limited to embodiments described below. The embodiments are provided to more completely describe the present invention to those skilled in the art. Therefore, a shape of an element in the drawing is exaggerated in order to emphasizing a more definite description.

An apparatus of the exemplary embodiment may be used for performing a photographing process for a circular substrate. In particular, the apparatus of the exemplary embodiment may be used for performing a coating process and a developing process for a substrate in connection with an exposure apparatus. However, a technical sprit of the present invention is not limited thereto, and may be used for various types of processes supplying a treating liquid to the substrate while rotating the substrate. Hereinafter, a case where a wafer is used as the substrate will be described as an example.

Hereinafter, an exemplary embodiment of the present invention will be described with reference to FIGS. 1 to 15.

Figure 2:
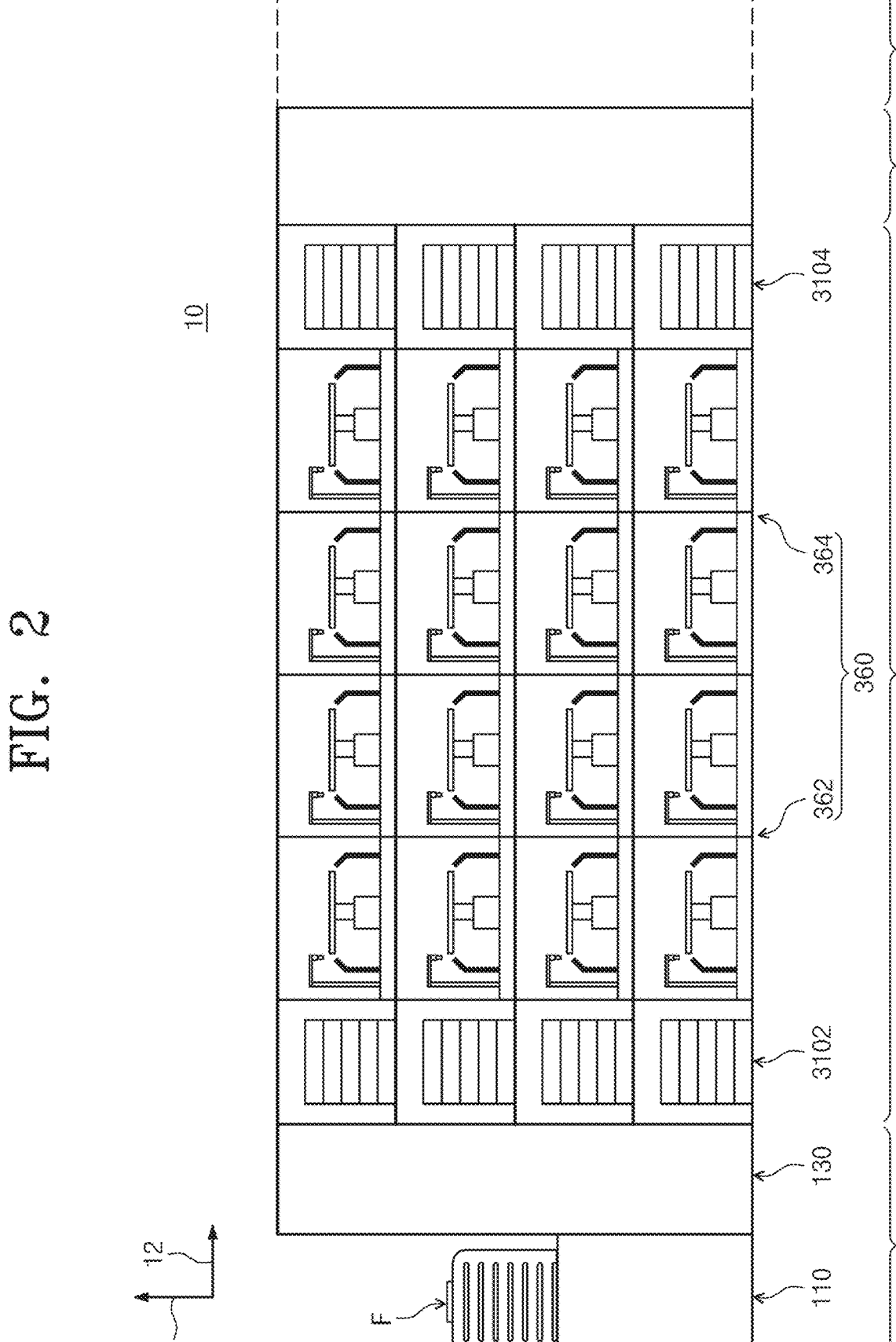
FIG. 2 is a front view of the apparatus for treating a substrate illustrating a coating block or a developing block in FIG. 1.
Figure 3:
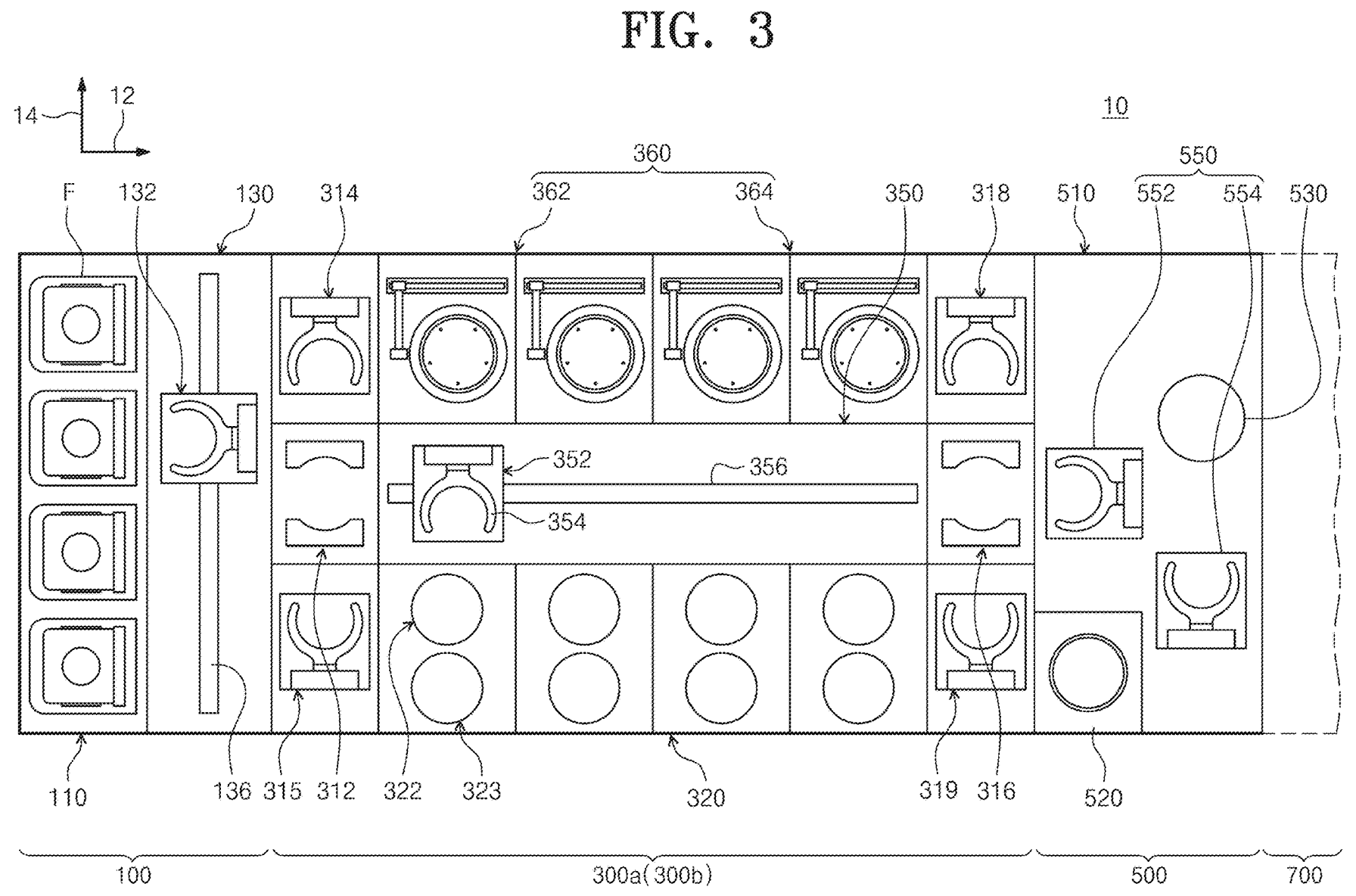

FIG. 1 is a perspective view schematically illustrating an apparatus for treating a substrate according to an exemplary embodiment of the present invention, FIG. 2 is a front view of the apparatus for treating a substrate illustrating a coating block or a developing block in FIG. 1, and FIG. 3 is a plan view of the apparatus for treating a substrate in FIG. 1.

Referring to FIGS. 1 to 3, the substrate treating apparatus 10 according to an exemplary embodiment of the present invention includes an index module 100, a treating module 300, and an interface module 500. According to an exemplary embodiment, the index module 100, the treating module 300, and the interface module 500 are sequentially arranged in line. Hereinafter, a direction in which the index module 100, the treating module 300, and the interface module 500 are arranged will be defined as a first direction 12, a direction vertical to the first direction when viewed from the top will be defined as a second direction 14, and a direction vertical to both the first direction 12 and the second direction 14 will be defined as a third direction 16.

The index module 100 transfers the substrate W to the treating module 300 from a container F storing the substrate W and stores the substrate W of which treating is completed in the container F. A longitudinal direction of the index module 100 is provided as the second direction 14. The index module 100 has a load port 110 and an index frame 130. The load port 120 is positioned at an opposite side to the treating module 300 based on the index frame 130. The container F storing the substrates W is placed in the load port 110. A plurality of load ports 110 may be provided, and the plurality of load ports 110 may be arranged in line in the second direction 14.

A sealing container F such as a front opening unified pod (FOUP) may be used as the container F. The container F may be placed on the load port 110 by a transportation means (not illustrated) or a worker such as overhead transfer, overhead conveyor, or an automatic guided vehicle.

An index robot 132 IS provided inside the index frame 130. A guide rail 136 in which a longitudinal direction is provided as the second direction 14 may be provided inside the index frame 130, and the index robot 132 may be provided to be movable on the guide rail 136. The index robot 132 may include a hand on which the substrate W is placed, and the hand may be provided to be rotatable with the third direction 16 as the axis and movable in the third direction 16.

The treating module 300 may perform a coating process and a developing process for the substrate W. The treating module 300 may perform a substrate treating process by receiving the substrate W stored in the container F. The treating module 300 has a coating block 300a and a developing block 300b. The coating block 300a performs a coating process for the substrate W and the developing block 300b performs a developing process for the substrate W. A plurality of coating blocks 300a is provided and the coating blocks 20a are provided to be laminated on each other. A plurality of developing blocks 300b is provided and the developing blocks 300b are provided to be laminated on each other. According to the exemplary embodiment of FIG. 1, two coating blocks 300a are provided and two developing blocks 300b are provided. The coating blocks 300a may be arranged below the developing blocks 320b. According to an example, two coating blocks 300a may perform the same process and may be provided in the same structure. Further, two coating blocks 300b may perform the same process and may be provided in the same structure.

Referring to FIG. 3, the coating block 300a includes a heat treating chamber 320, a transfer 350, a coating treating chamber 360, and buffer chambers 312 and 316. The heat treating chamber 320 performs the heat treating process for the substrate W. The heat treating process may include a cooling process and a heating process. The coating treating chamber 360 forms a film by supplying the liquid onto the substrate W. The film may be a photoresist film or an anti-reflective film. The transfer chamber 350 transfers the substrate W between the heat treating chamber 320 and the coating processing chamber 360 in the coating block 300a.

The longitudinal direction of the transfer chamber 350 is provided in parallel to the first direction 12. A transfer robot 352 are provided to the transfer chamber 350. The transfer robot 352 transfers the substrate among the heat treating chamber 320, the coating processing chamber 360, and buffer chambers 312 and 316. According to an example, the transfer robot 352 may include a hand 354 on which the substrate W is placed, and the hand 354 may be provided to be movable forward and backward, rotatable with the third direction 16 as the axis, and movable in the third direction 16. A guide rail 356 in which the longitudinal direction is provided in parallel to the first direction 12 may be provided inside the transfer chamber 350, and the transfer robot 352 may be provided to be movable on the guide rail 356.

Figure 4:
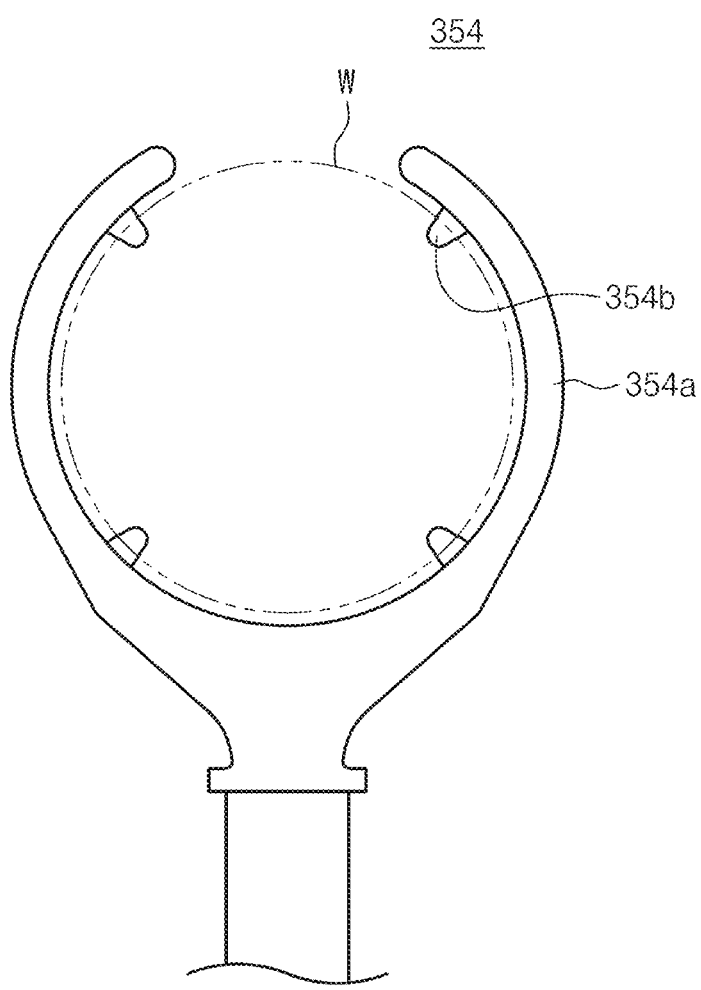
FIG. 4 is a plan view schematically illustrating a transfer robot in FIG. 3.

FIG. 4 is a plan view schematically illustrating a transfer robot in FIG. 3. Referring to FIG. 3, the hand 354 includes a base 354a and a support protrusion 354b. The base 354a may have an annular ring shape in which a part of a circumference is bent. The base 354a has an inner diameter larger than a diameter of the substrate W. The support protrusion 354b extends inward from the base 354a. A plurality of support protrusions 354b is provided, and supports an edge region of the substrate W. According to an example, four support protrusions 354 may be provided at an equal interval.

A plurality of heat treating chambers 320 is provided. The heat treating chambers 320 are arranged to be listed in the first direction 12. The heat treating chambers 320 are arranged at one side of the transfer chamber 350.

Figure 5:
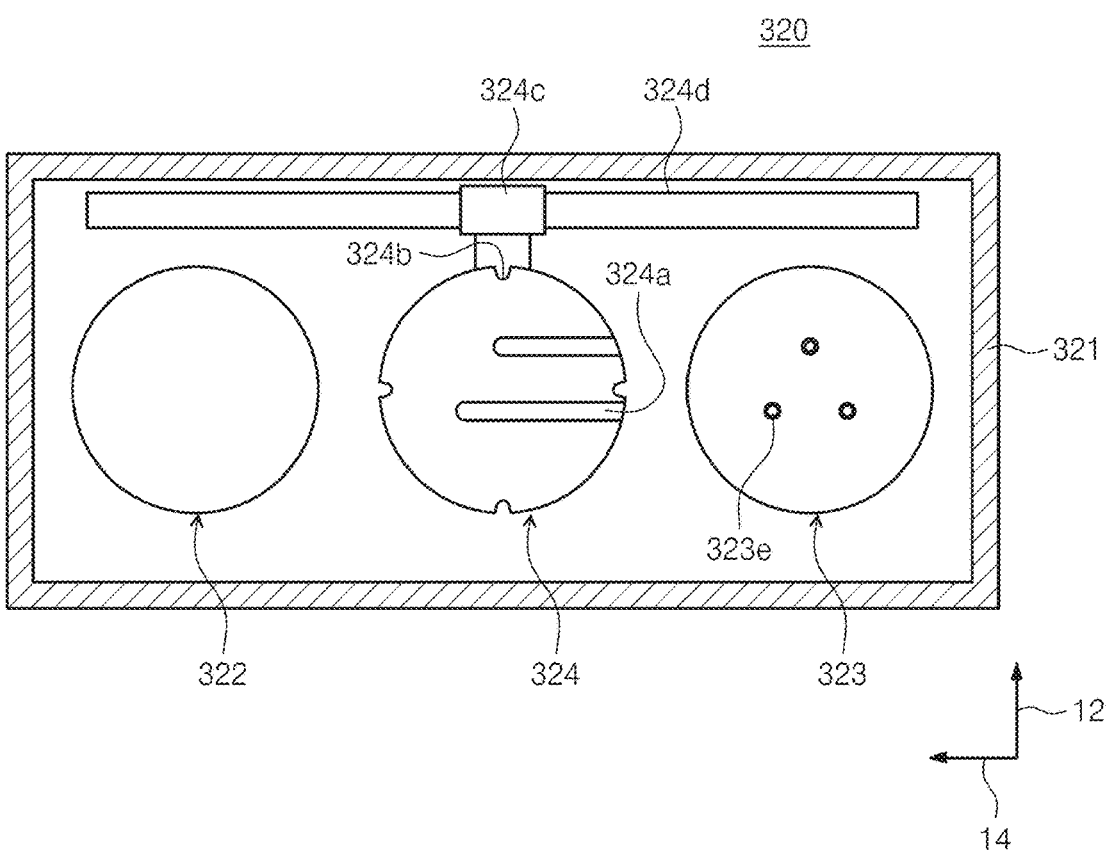
FIG. 5 is a plan view schematically illustrating an example of a heat treating chamber in FIG. 3.
Figure 6:
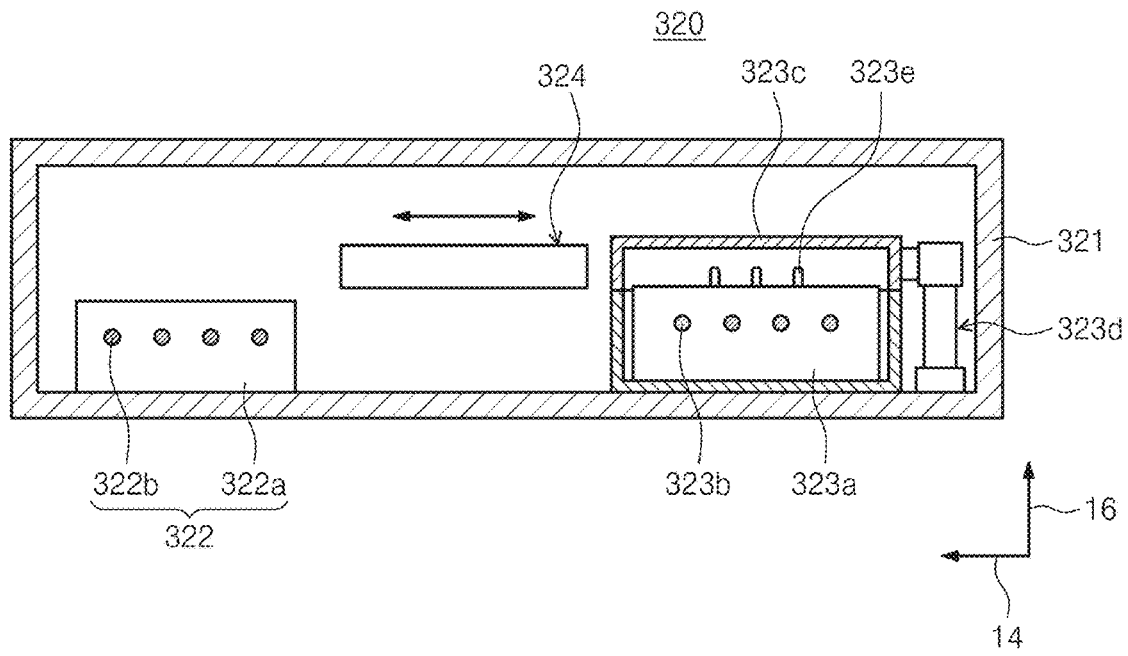
FIG. 6 is a front view of the heat treating chamber in FIG. 3.

FIG. 5 is a front view schematically illustrating an example of the heat treating chamber in FIG. 3 and FIG. 6 is a front view of the heat treating chamber in FIG. 3.

Referring to FIGS. 5 and 6, the heat treating chamber 320 includes a housing 321, a cooling unit 322, a heating unit 323, and a transfer plate 324.

The housing 321 is provided in a substantially rectangular parallelepiped shape. A hatch (not illustrated) through which the substrate W enters and exits is formed on a side wall of the housing 321. The hatch may be maintained in an opened state. A door (not illustrated) may be provided to selectively open/close the hatch. The cooling unit 322, the heating unit 323, and the transfer plate 324 are provided in the housing 321. The cooling unit 322 and the heating unit 323 are provided in line in the second direction 14. According to an example, the cooling unit 322 may be positioned closer to the transfer chamber 350 than the heating unit 323.

The cooling unit 322 has a cooling plate 322a. The cooling plate 322a may have a substantially circular shape when viewed from the top. A cooling member 322b is provided to the cooling plate 322a. According to an example, the cooling member 322b may be formed inside the cooling plate 322a, and provided as a path which a cooling fluid flows.

The heating unit 323 includes a heating plate 323a, a cover 323c, and a heater 323b. The heating plate 323a may have the substantially circular shape when viewed from the top. The heating plate 323a has a larger diameter than the substrate W. The heater 323b is installed in the heating plate 323a. The heater 323b may be provided as a heating resistor to which current is applied. Lift pins 323e are provided on the heating plate 323a, which are drivable in the up and down direction in the third direction 16. The lift pin 323e carries in the substrate W from a transfer means outside the heating unit 323 and lays down the substrate W onto the heating plate 323 or lifts the substrate W from the heating plate 323a and caries over the substrate W to the transportation means outside the heating unit 323. According to an example, three lift pins 323e may be provided. The cover 323c has a space of which lower portion is opened therein. The cover 323c is positioned at an upper portion of the heating plate 323 and moved in the up and down direction by a driver 323d. A space in which the cover 323c and the heating plate 323a by moving the cover 323c is provided as a heating space heating the substrate W.

The transfer plate 324 is provided in a substantially disk shape, and has a diameter corresponding to the substrate W. A notch 324b is formed at an edge of the transfer plate 324. The notch 324b may have a shape corresponding to the protrusion 354b formed in the hand 354 of the transfer robot 352. Further, the notch 324b is provided as a number corresponding to the support protrusion 354 formed in the hand 354 and formed at a location corresponding to the protrusion 354b. When upper and lower locations of the hand 354 and the transfer plate 324 are changed at locations at which the hand 354 and the transfer plate 324 are aligned in the up and down direction, the substrate W is delivered between the hand 354 and the transfer plate 324. The transfer plate 324 may be mounted on the guide rail 324b, and moved along the guide rail 324d by the driver 324c. A plurality of slit-shaped guide grooves 324a is provided in the transfer plate 324. The guide groove 324a extends from an end of the transfer plate 324 to an inside of the transfer plate 324. The guide groove 324a is provided along the second direction 14 as the longitudinal direction, and the guide grooves 324a are positioned spaced apart from each other in the first direction 12. The guide groove 324a prevents the transfer plate 324 and the lift pin 323e from interfering with each other when the substrate W is carried in and over between the transfer plate 324 and the heating unit 323.

The substrate W is cooled while the transfer plate 324 on which the substrate W is placed is in contact with the cooling plate 322a. The transfer plate 324 is provided as a material having a high thermal conductivity so as to excellently transmit the heat between the cooling plate 322a and the substrate W. According to an example, the transfer plate 324 may be provided as a metallic material.

The heating unit 323 provided in some heat treating chambers 320 among the heat treating chambers 320 may enhance an attachment rate of a photoresist to the substrate W by supplying gas while heating the substrate W. According to an example, the gas may be hexamethyldisilane (HMDS) gas.

A plurality of coating treating chambers 360 is provided. Some of the coating treating chambers 360 may be provided to be laminated on each other. The coating treating chambers 360 are arranged at one side of the transfer chamber 350. The coating treating chambers 360 are arranged in line in the first direction 12. Any some of the coating treating chambers 360 are provided at locations adjacent to the index module 100. Hereinafter, the coating treating chamber 360 is referred as a front liquid treating chamber 362. Other some of the coating treating chambers 360 are provided at locations adjacent to the interface module 500. Hereinafter, the coating treating chamber 360 is referred as a rear liquid treating chamber 364.

The front liquid treating chamber 362 coats the substrate W with a first liquid and the rear liquid treating chamber 364 coats the substrate W with a second liquid. The first treating liquid and the second treating liquid may be different types of liquids. According to an exemplary embodiment, the first treating liquid is the anti-reflective film and the second treating liquid is the photoresist. The substrate W coated with the anti-reflective film may be coated with the photoresist. Optionally, the first treating liquid may be the photoresist and the second treating liquid may be the anti-reflective film. In this case, the substrate W coated with the photoresist may be coated with the anti-reflective film. Optionally, the first treating liquid and the second treating liquid may be the same type of liquids, and both the first treating liquid and the second treating liquid may be the photoresist.

Hereinafter, a structure of the substrate treating apparatus that supplies the liquid on the rotating substrate to form the film among the process chambers according to the present invention will be described in detail. Hereinafter, a case where the substrate treating apparatus is an apparatus that coats the photoresist will be described as an example. However, the substrate treating apparatus may be an apparatus that forms a protective film or the anti-reflective film on the rotating substrate W. Further, optionally, the substrate treating apparatus may be an apparatus that supplies a treating liquid such as a developing liquid to the substrate W.

Figure 7:
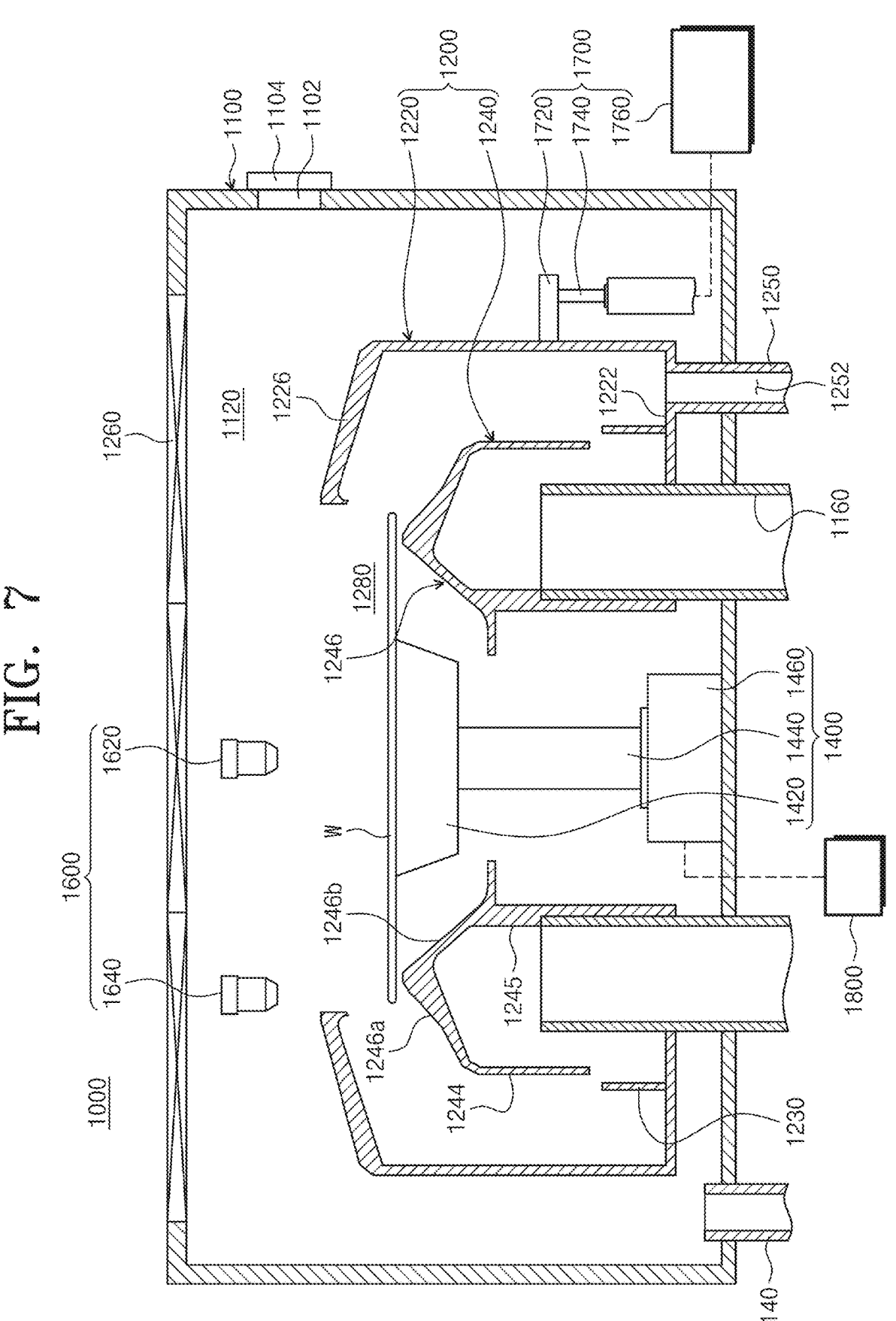
FIG. 7 is a cross-sectional view schematically illustrating a structure of an apparatus for treating a substrate, which treats the substrate by supplying a liquid to a rotating substrate according to an exemplary embodiment of the present invention.

FIG. 7 is a cross-sectional view schematically illustrating a structure of an apparatus for treating a substrate, which treats the substrate by supplying a liquid to a rotating substrate according to an exemplary embodiment of the present invention.

Referring to FIG. 7, the liquid treating chamber includes a housing 1100, a treating container 1200, a substrate support unit 1400, and a liquid supply unit 1600.

The housing 1100 is provided in a rectangular cylindrical shape having an inner space 1120. An opening 1102 is formed at one side of the housing 1100. The opening 1102 serves as a passage through which the substrates W is carried in and over. A door 1104 is installed in the opening 1102, and the door 1104 opens/closes the opening 1102.

The treating container 1200 is provided in the inner space 1120 of the housing 1100. The treating container 1200 has a treating space 1280. The treating space 1280 is provided so that an upper portion is opened.

The support unit 1400 supports the substrate W in the treating space 1280 of the treating container 1200. The support unit 1400 has a support plate 1420, a rotation axis 1440, and a driver 1460. An upper surface of the support plate 1420 is provided as a circular shape. The support plate 1420 has a smaller diameter than the substrate W. The support plate 1420 is provided to support the substrate W by a vacuum pressure. Optionally, the support plate 1420 may have a mechanical clamping structure supporting the substrate W. The rotational axis 1440 is coupled to a bottom center of the support plate 1420, and the driver 1460 is provided to the rotational axis 1440, which provides rotational force to the rotation axis 1440. The driver 1460 may be a motor.

The liquid supply unit 1600 supplies the liquid onto the substrate W. The liquid supply unit 1600 may supply various types of liquids onto the substrate W. According to an example, the liquid supply unit 1600 may supply a coating liquid, an edge bead removal liquid, etc., onto the substrate W.

The liquid supply unit 1600 includes a film forming unit and an edge bit removal unit. The film forming unit includes a first nozzle 1620 supplying a first liquid L1 onto the substrate W, a guide member (not illustrated), and an arm (not illustrated). The first liquid L1 may be the coating liquid such as the photoresist. The guide member and the arm move the first nozzle 1620 to a process location and a waiting location. Here, the process location is defined as a location facing the substrate W, and the waiting location is defined as a location which deviates from the process location. The guide member includes a guide rail (not illustrated) that moves the arm in a horizontal direction. The guide rail is positioned at one side of the treating container 1200. The guide rail is provided so that the longitudinal direction faces the horizontal direction. According to an example, the longitudinal direction of the guide rail may be provided to face a direction parallel to the first direction. The arm is installed in the guide rail. The arm may be moved by a linear motor (not illustrated) provided inside the guide rail. The arm is provided to face a longitudinal direction vertical to the guide rail when viewed from the top. One end of the arm is mounted on the guide rail. A first nozzle 1620 is installed on the bottom of the other end of the arm. Optionally, the arm may be rotated while being coupled to a rotational axis of which longitudinal direction faces a third direction.

The edge bid removal unit performs an edge bead removal (EBR) process. The edge bead removal unit moves a coating liquid film formed at an edge region in the film formed on the substrate W. The edge bead removal unit exposes an edge portion of the substrate W from the coating liquid film. The edge bead removal unit includes a second nozzle 1640 supplying a second liquid L2, a guide member (not illustrated), an arm (not illustrated), and a cleaning member (not illustrated). The guide member and the arm of the edge bead removal unit are provided to have the same shape as the guide member and the arm of the film forming unit. The guide member and the arm of the edge bead removal unit may be driven independently from the film forming unit. A detailed description of the guide member and the arm of the edge bead removal unit will be omitted.

The second nozzle 1640 discharges the second liquid L2 onto the coating film coated on the substrate W. The second nozzle 1640 supplies the second liquid L2 to the edge portion of the substrate W. The second liquid L2 includes an edge bead removal liquid. For example, the first liquid L1 may be an organic material, and the second liquid L2 may react with the organic material. The first liquid L1 may be a photosensitive liquid such as the photoresist, and the second liquid L2 may be a thinner.

A fan filter unit 1260 supplying a descending air flow to the inner space is disposed on an upper wall of the housing 1100. The fan filter unit 1260 has a fan introducing external air to the inner space, and a filter filtering the external air.

An outer exhaust pipe 1140 that exhausts an air flow supplied to a space between the treating container 1200 and the housing 1100 to an outside of the treating container 1200 in the housing 1100, and an inner exhaust pipe 1160 that exhausts the air flow supplied to the inner space of the treating container 1200 are connected. An pressure control member (not illustrated) is installed in the outer exhaust pipe 1140 and the inner exhaust pipe 1160 so as to forcibly suction the air flow in an exhaust space. The pressure control member may be a pump.

The treating container 1200 has an outer cup 1220 and an inner cup 1240.

The outer cup 1220 is provided to surround the support unit 1400 and the substrate W supported thereon. The outer cup 1220 has a bottom wall 1222, a side wall 1224, and an upper wall 1226. An inside of the outer cup 1220 is provided as the treating space 1280.

The bottom wall 1222 is provided in the circular shape, and has an opening at a center. The side wall 1224 extends upward from an outer end of the bottom wall 1222. The side wall 1224 is provided in a ring shape, and provided vertically to the bottom wall 1222. According to an example, the side wall 1224 extends up to the same height as an upper surface of the support plate 1420 or extends up to a height a little lower than the upper surface of the support plate 1420. The upper wall 1226 has the ring shape, and has the opening at the center. The upper wall 1226 is provided inclined upward toward a central axis of the outer cup 1220 from an upper end of the side wall 1224.

The inner cup 1240 is positioned at an inner side of the outer cup 1220. The inner cup 1240 has an inner wall 1242, an outer wall 1244, and an upper wall 1246. The inner wall 1242 has a penetration hole penetrated in the up and down direction. The inner wall 1242 is disposed to surround the driver 1460. The inner wall 1242 minimizes exposure of the driver 1460 to the air flow in the treating space 1280. The rotational axis 1440 and/or the driver 1460 of the support unit 1400 extend in the up and down direction through the penetration hole. A lower end of the inner wall 1242 may be located on the bottom wall 1222 of the outer cup 1220. The outer wall 1244 is disposed to be spaced apart from the inner wall 1242, and to surround the inner wall 1242. The outer wall 1244 is located spaced apart from the side wall 1224 of the outer cup 1220. The inner wall 1242 is disposed spaced apart upward from the bottom wall 1222 of the outer cup 12220 The upper wall 1246 connects the upper end of the outer wall 1244 and the upper end of the inner wall 1242. The upper wall 1246 has the ring shape, and is disposed to surround the support plate 1420. According to an example, the upper wall 1246 has a shape of being convex upward. The upper wall 1246 has an outer upper wall 1246*a* inclined upward toward the rotational axis 1440 from the upper end of the outer wall 1244, and an inner upper wall 1246*b* inclined downward up the upper end of the inner wall 1242 from the outer upper wall 1246*a*. The support plate 1420 may be located in a space surrounded by the inner upper wall 1246*b*. According to an example, a peak point in the upper wall 1226 may be located outside the support plate 1420, and located inside the end of the substrate W supported on the support unit 1400.

A gas-liquid separation plate 1230 may be provided to the treating space 1280 of the treating container 1200. The gas-liquid separation plate 1230 may be provided to extend upward from the bottom wall 1222 of the outer cup 12220. The gas-liquid separation plate 1230 may be provided in the ring shape. The gas-liquid separation plate 1230 may be located between the side wall 1224 of the outer cup 1220 and the outer wall 1244 of the inner cup 1240 when viewed from the top. Optionally, the gas-liquid separation plate 1230 may be located to overlap with the outer wall 1244 of the inner cup 1240 or located inside the outer wall 1244 of the inner cup 1240 when viewed from the top. According to an example, the upper end of the gas-liquid separation plate 1230 may be located at a position lower than the lower end of the outer wall 1244 of the inner cup 1240.

The inner exhaust pipe 1160 is connected to the bottom wall 1222 of the outer cup 1220. The inner exhaust pipe 1160 exhausts the air flow introduced into the inner space 1280 of the treating container 1200. The inner exhaust pipe 1160 is located closer to the inner cup 1240 than to the outer cup 1220. When viewed from the top, the inner exhaust pipe 1160 is provided to overlap with the inner cup 1240.

A discharge pipe 1250 for discharging the treating liquid is connected to the bottom wall 1222 of the outer cup 1220. The discharge pipe 1250 discharges the treating liquid introduced between the side wall 1224 of the outer cup 1220 and the outer wall 1244 of the inner cup 1240 to the outside of the treating container 1200. According to an example, a space between the side wall 1224 of the outer cup 1220 and the gas-liquid separation plate 1230 is provided as a discharge space for discharging the treating liquid, and the discharge pipe 1250 is provided to discharge the treating liquid in the discharge space. The air flow which flows to the space between the side wall 1224 of the outer cup 1220 and the outer wall 1244 of the inner cup 1240 is introduced into the space surrounded by the side wall 1224 and the bottom wall 1222 of the outer cup 1220, and the gas-liquid separation plate 1230, and exhausted through the inner exhaust pipe 1160. In this process, the treating liquid contained in the air flow is discharged to the outside of the treating container 1200 from the discharge space through the discharge pip 1250, and the air flow is exhausted by an exhaust unit (not illustrated) of the treating container 1200.

One or a plurality of discharge pipes 1250 may be provided. When the plurality of discharge pipes 1250 is provided, the plurality of discharge pipes 1250 may be provided in a circumferential direction of the inner cup 1240.

The substrate treating apparatus 1000 includes an elevation unit 1700. The elevation unit 1700 adjusts a relative height between the treating container 1200 and the support unit 1400. The elevation unit 1700 moves the treating container 1200 in the up and down direction. Specifically, the elevation unit 1700 may control relative heights of the support plate 1420 and the outer cup 1220. According to an example, the elevation unit 1700 moves the outer cup 1220 up and down in the up and down direction. For example, when the substrate W is loaded to the support plate 1420 or the substrate W is unloaded from the support plate 1420, the support plate 1420 is located at a height higher than the upper end of the outer cup 1220 so as to prevent the transfer robot 352 transferring the substrate W from interfering with the outer cup 1220. Further, the support plate 1420 is located at a height lower than the upper end of the outer cup 1220 so that the substrate W is located in the treating space when conducting the process.

The elevation unit 1700 includes a bracket 1720, a movement axis 1740, and a driver 1760. The bracket 1720 connects the treating container 1200 and the movement axis 1740. The bracket 1720 is fixed to the outer cup 1220 of the treating container 1200. The bracket 1720 is fixedly installed on the side wall 1224 of the outer cup 1220. The movement axis 1740 is provided so that the longitudinal direction faces the up and down direction. The upper end of the movement axis 1740 is fixedly coupled to the bracket 1720. The movement axis 1740 may receive power from the driver 1760. The movement axis 1740 is moved from the driver 1760 in the up and down direction, and the treating container 1200 is elevatably moved jointly with the movement axis 1740. The driver 1760 provides the power to the movement axis 1740. The driver 1760 provides the power so that the movement axis 1740 performs a reciprocal linear motion or an elevatable motion. For example, the driver 1760 may be a cylinder or the motor.

The controller 1800 may control an overall operation of the substrate treating apparatus 10. The controller 1800 may control each component of the substrate treating apparatus 10. The controller 1800 may include a central processing unit (CPU), a read only memory (ROM), and a random access memory (RAM). The CPU executes desired treating according to various recipes stored in storage areas of the CPU, the ROM, and the RAM. A process time, a process pressure, a process temperature, various gas flow rates, etc., which are control information of an apparatus for a process condition are input into the recipe. Meanwhile, the programs or the recipe representing a treating condition may also be stored in a hard disk or a semiconductor memory. Further, the recipe may be set at a predetermined position of the storage area while being stored in a storage medium readable by a portable computer, such as CD-ROM, DVD, etc.

The controller 1800 controls a rotational velocity of the substrate W. As an example, the controller 1800 may control the rotational velocity of the substrate W through control of the support unit 1400. The controller 1800 controls the substrate W to rate at a second rotational velocity v2 when a liquid supply step of supporting the first liquid L1 to the substrate W is performed, controls the substrate W to rotate at a third rotational velocity v3 when an edge bead removal step of supporting the second liquid L2 to the substrate W is performed, and controls the substrate W to rotate at a first rotational velocity v1 in a waiting step in which a coating process is terminated and waiting is conducted. The controller 1800 controls the first rotational velocity v1 to have a velocity lower than the second rotational velocity v2 and the third rotational velocity v3. Further, the controller 1800 controls the third rotational velocity v3 to have a velocity lower than the second rotational velocity v2. As an example, the controller 1800 controls the first rotational velocity v1 to have 10 to 20 rpm.

Hereinafter, a substrate treating method according to an exemplary embodiment of the present invention will be described in detail with reference to FIGS. 8 to 15.

Figure 8:
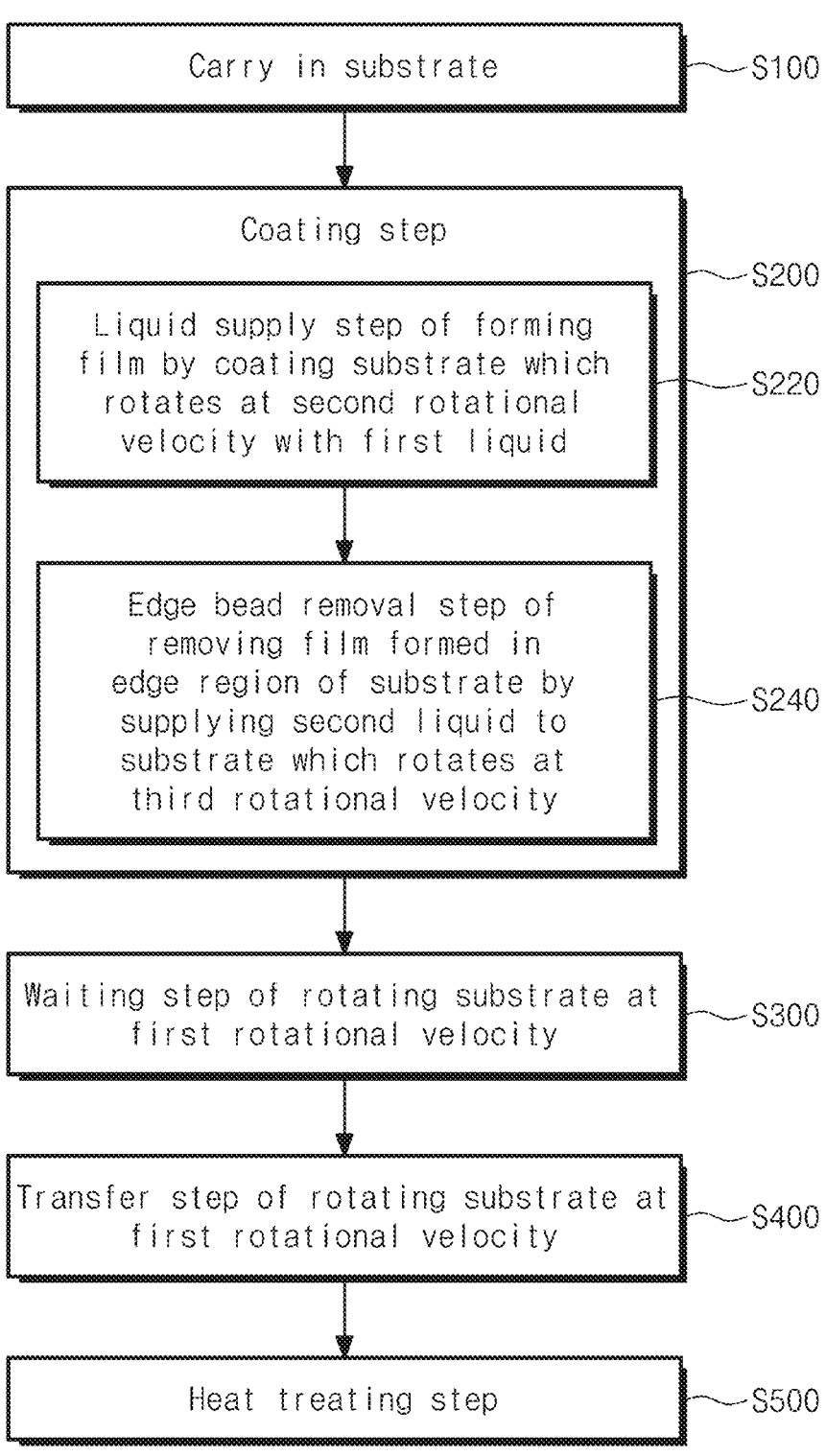
FIG. 8 is a flowchart of a method for treating a substrate according to an exemplary embodiment of the present invention.

FIG. 8 is a flowchart of a method for treating a substrate according to an exemplary embodiment of the present invention, and FIGS. 9 to 13 are diagrams illustrating a process of treating a substrate by using the apparatus for treating a substrate in FIG. 7.

The substrate treating method includes a substrate carry-in step S100, a coating step S200, a waiting step S300, a transfer step S400, and a heat treating step S500.

Figure 9:
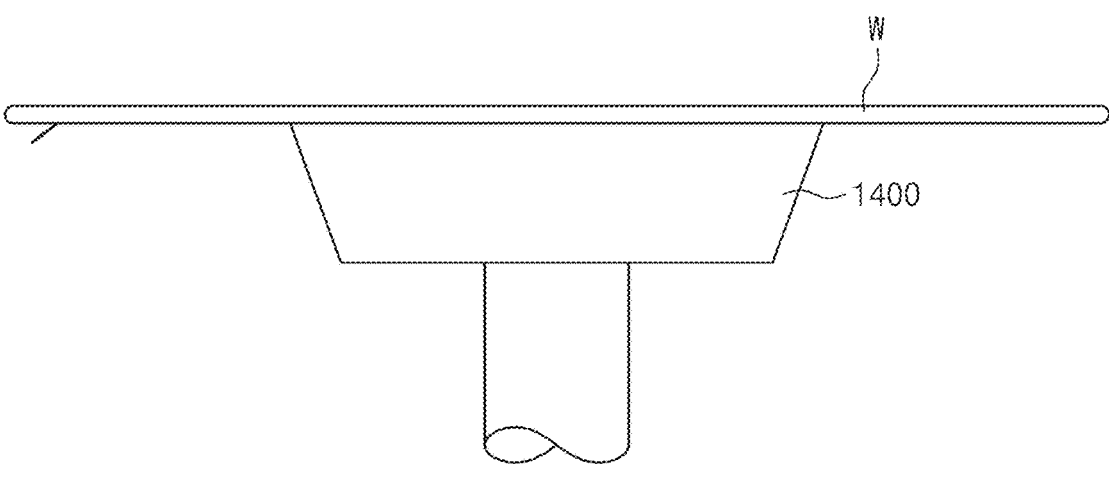
FIGS. 9 to 13 are diagrams illustrating a process of treating a substrate by using the apparatus for treating a substrate in FIG. 7.
Figure 10:
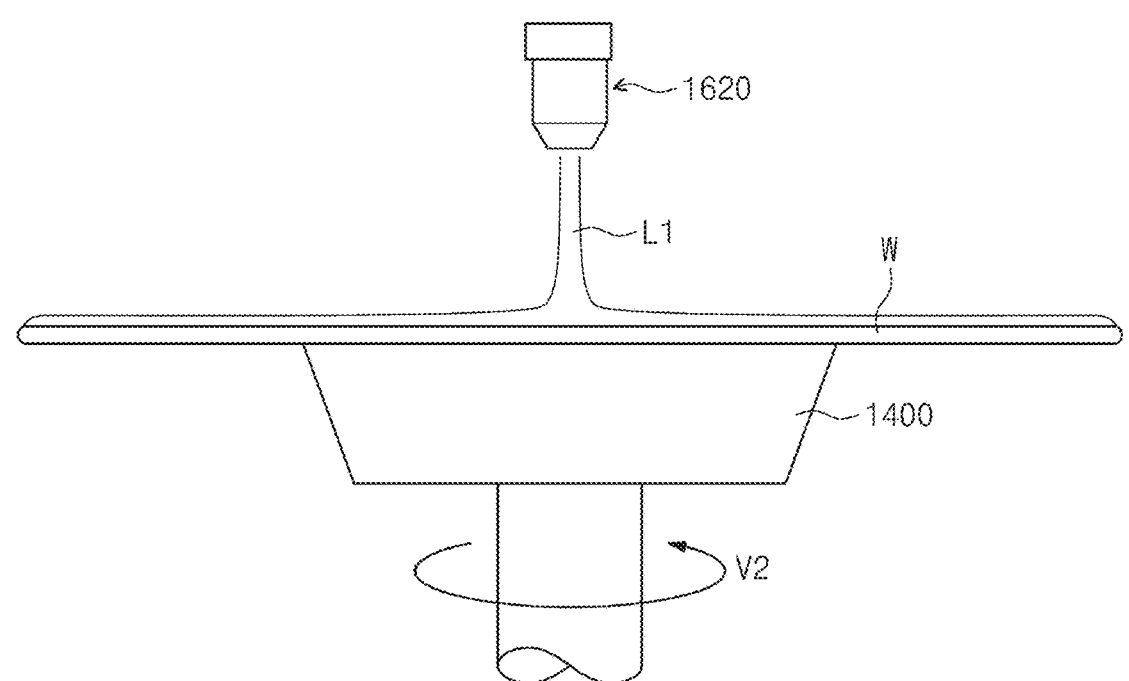
Figure 11:
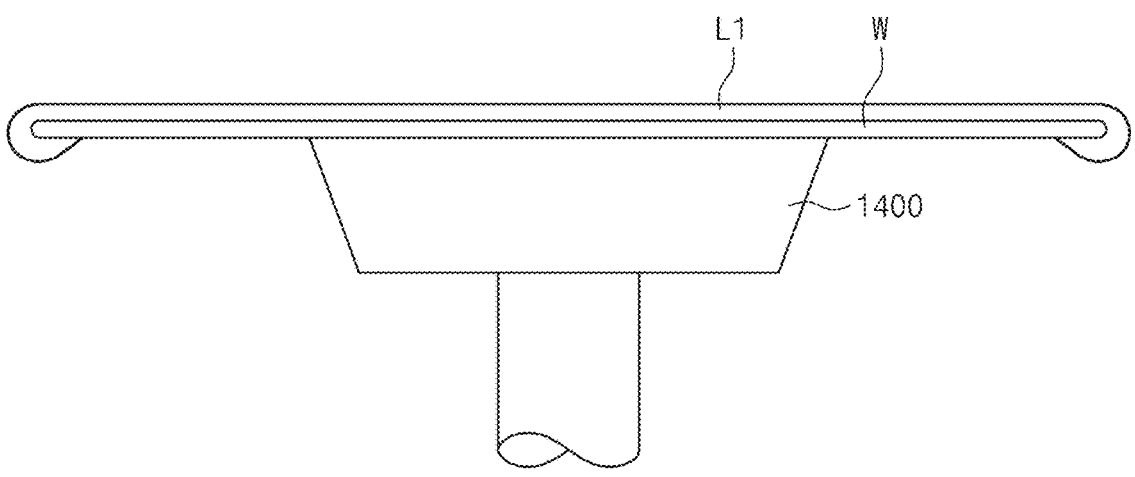
Figure 12:
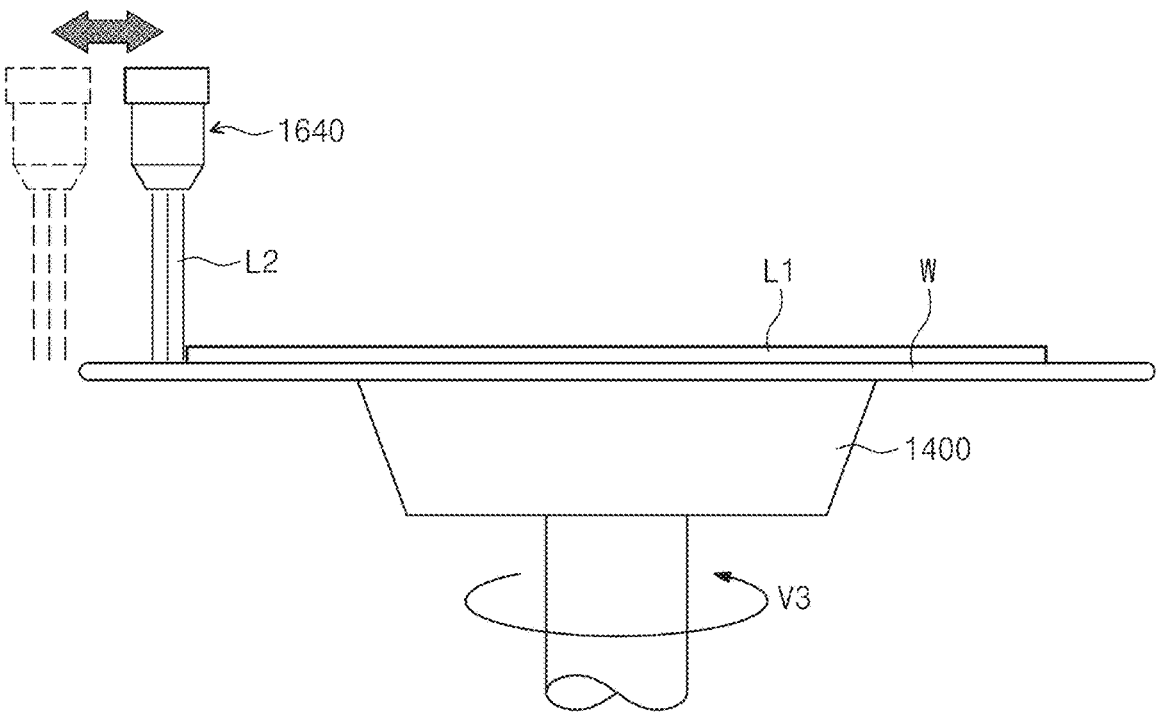

Referring to FIGS. 8 and 9, the substrate W is carried into the housing 1100 of the substrate treating apparatus 1000. The substrate W is input into the housing 1100 by the transfer robot 352, and in this case, a door 1104 is opened. The substrate W is carried into the housing 1100 through an opening 1102 while seating on the hand 354 of the robot 352 and seated on the support unit 1400.

In the coating step S200, a coating process of forming the film on the rotating substrate W is performed. The coating step S200 includes a liquid supply step S200 of forming the film on the substrate by supplying the first liquid L1 to the substrate W which rotates at the second rotational velocity v2 (see FIGS. 8 and 10), and an edge bead removal step S240 of removing the film of the edge area of the substrate W in the film formed on the substrate W by supplying the second liquid L2 to the substrate W which rotates at the third rotational velocity v3 (see FIGS. 8, 11, and 12). In this case, the controller 1800 controls the third rotational velocity v3 of the substrate W in the edge bead removal step and the second rotational velocity v2 of the substrate W in the liquid supply step to be lower than the second rotational velocity v2 of the substrate W. That is, the third rotational velocity v3 may be lower than the second rotational velocity v2.

Figure 13:
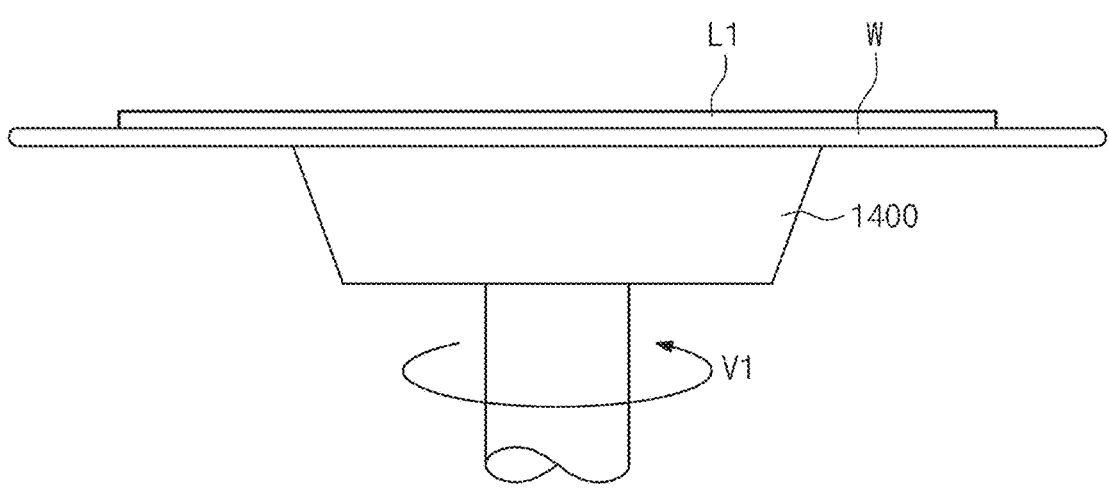

Referring to FIGS. 8 and 13, the waiting step is a step in which the substrate W for which the coating step S200 is terminated waits in the coating treating chamber 360 before being transferred to the heat treating chamber 320. In this case, the controller 1800 controls the waiting substrate W to maintain a state of being rotated at the first rotational velocity v1. The first rotational velocity v1 may be lower than the second rotational velocity v2 and the third rotational velocity v3. As an example, the first rotational velocity v1 may be 10 rpm to 20 rpm. The controller 1800 rotates the waiting substrate W at the first rotational velocity v1 until the transfer robot 352 is located at a set position. The controller 1800 stops rotation of the substrate W when the transfer robot reaches the set position, and the transfer robot 352 picks up the substrate W, and transfers the corresponding substrate W to the heat treating chamber 320. In this case, the set position means a position where the transfer robot 352 is located in front of the door 1004 of the substrate treating apparatus 1000 performing the coating process. That is, the controller 1800 rotates the substrate W at the first rotational velocity v1 until the transfer robot 352 is located in front of the door 1104 for the substrate W for which the coating process is terminated, and stops the rotation of the substrate W when the transfer robot 352 is located in front of the door 1104.

Thereafter, the transfer robot 352 is introduced into the housing 1100 through the opening 1102 to picks the stopped substrate W. The transfer robot 352 transfers the substrate W for which the coating process is terminated to a chamber in which a subsequent treating process is performed (transfer step S400). As an example, subsequent treating may be a heat treating process, and in this case, the transfer robot 352 transfers the substrate W to the heat treating chamber 320. The heating treating process of stabilizing the coating liquid film on the substrate is performed for the substrate W transferred to the heat treating chamber 320 (heat treating step S500).

The substrate treating apparatus 1000 includes an air flow supply unit that is disposed on the upper wall of the housing 1100 and provides the descending air flow to the inner space 1120. The air flow supply unit is provided the fan filter unit 1260. The descending air flow is formed in the inner space 1120 of the housing 1100 by the fan filter unit 1260. The fan filter unit 1260 includes a case (not illustrated) having an inlet through which the external air is introduced, a diffusion space in which the air introduced through the inlet is diffused, and a plurality of holes in which the air introduced to the diffusion space down-flows. A supply pipe (not illustrated) that supplies the external air to the diffusion space is connected to the inlet. In this a connection pipe includes a first pipe part of which longitudinal direction extends in a direction which is in line with the side wall of the housing 1100 and a second pipe part in which one end extends in a direction crossing the longitudinal direction of the first pipe part and the other end is connected to the inlet. The external air is supplied to the diffusion space by sequentially passing through the first pipe part, the second pipe part, and the inlet. In this case, the external air hits an inner wall of the connection pipe at a portion (a bent portion) where the first pipe part and the second pipe part meet to generate a vortex. A flow of the external air is not smooth due to the vortex, and as a result, the air down-flowing to the inner space 1120 of the housing 1100 may be supplied in a non-uniform state. Further, the same size is not provided due to a processing error of the plurality of holes in which the air introduced to the diffusion space down-flows, and as a result, the air supplied to the inner space 1120 may be supplied in the non-uniform state.

Figure 14:
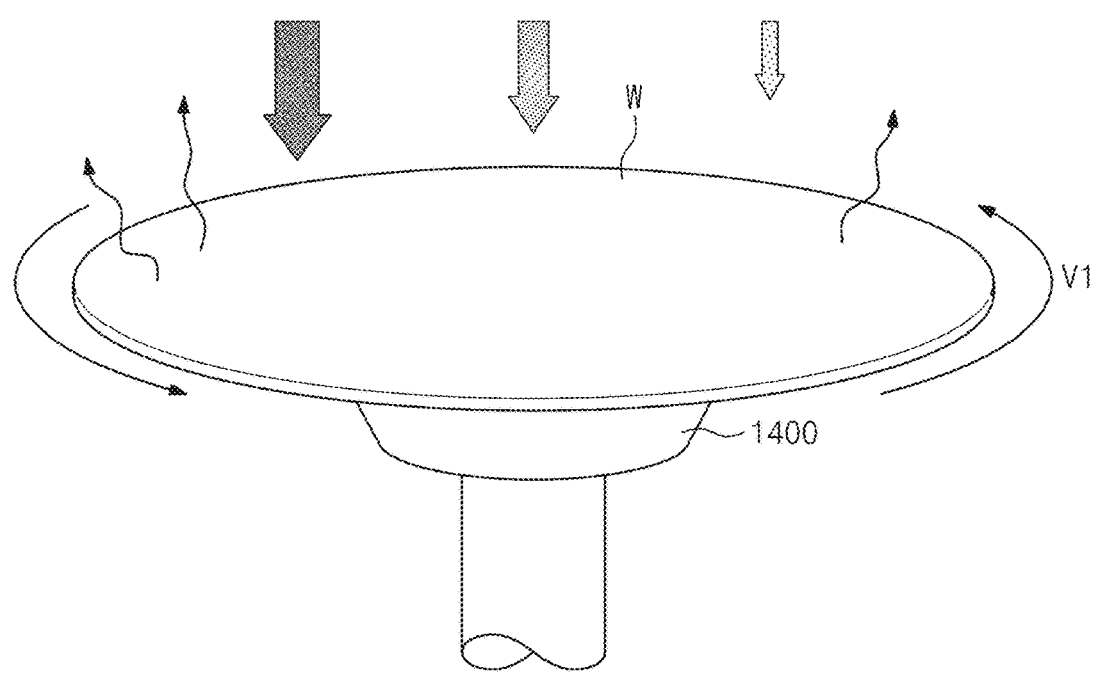
FIG. 14 is a diagram schematically illustrating an evaporation state of a liquid for each position of the substrate when treating the substrate according to the method for treating a substrate according to an exemplary embodiment of the present invention.
Figure 15:
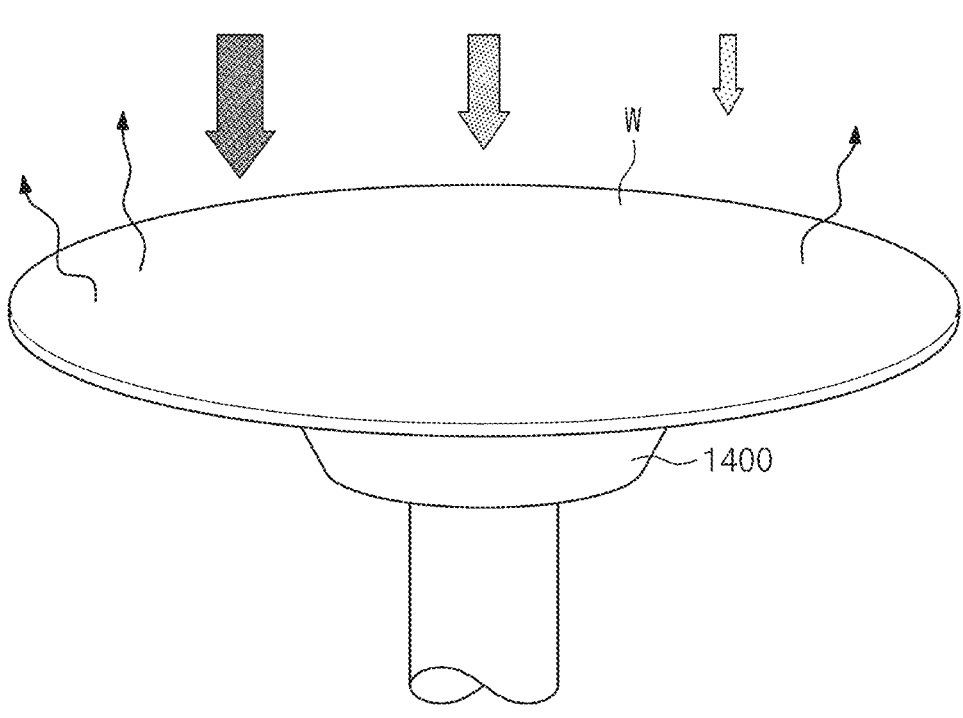
FIG. 15 is a diagram schematically illustrating an evaporation state of a liquid for each position of a substrate when treating the substrate according to a method for treating a substrate according to a comparative example.

FIG. 14 is a diagram schematically illustrating an evaporation state of a liquid for each position of the substrate when treating the substrate according to the method for treating a substrate according to an exemplary embodiment of the present invention, and FIG. 15 is a diagram schematically illustrating an evaporation state of a liquid for each position of a substrate when treating the substrate according to a method for treating a substrate according to a comparative example.

In the coating step in which the process is performed while the substrate W rotates, a liquid film having a uniform thickness may be formed on the substrate W without an influence from the non-uniform air flow in the inner space 1120. However, as illustrated in FIG. 15, when the substrate W waits in the stop state until the substrate W for which the coating process is terminated is transferred by the transfer robot 352, the non-uniform air flow of the inner space 1120 of the housing 1100 influences the liquid film coated on the substrate W. As an example, a coating liquid evaporation rate difference for each position of the substrate W which waits in the stop state may occur due to the non-uniform air flow of the inner space 1120 of the housing 1100. In this case, the thickness of the liquid film coated on the substrate W is different for each position of the substrate W not to secure uniformity of the liquid film. Furthermore, lowering the uniformity of the liquid film causes non-uniform etching in an etching process of forming a pattern by supplying an etching liquid to the substrate W and in this case, there is a problem in that a critical dimension (CD) of the pattern becomes non-uniform.

However, according to an exemplary embodiment of the present invention, the coating liquid evaporation rate difference for each local substrate (W) location by the air flow may be suppressed as the substrate W is maintained at a low-velocity rotation state in the waiting state as illustrated in FIG. 5. Further, the thickness uniformity of the coating liquid film may be enhanced. Further, the CD uniformity of the pattern may be enhanced.

Referring back to FIGS. 3 and 4, the developing block 300b has the same structure as the coating block 300a, and the liquid treating chamber provided to the developing block 300b supplies the developing liquid onto the substrate.

The interface module 500 connects the treating module 300 and an external exposure apparatus 700. The interface module 500 includes an interface frame 510, an additional process chamber 520, an interface buffer 530, and an interface robot 550.

A fan filter unit forming the descending air flow therein may be provided at the upper end of the interface frame 510. The additional process chamber 520, the interface buffer 530, and the interface robot 550 are disposed inside the interface frame 510. The additional process chamber 520 may perform a predetermined additional process before the substrate W of which process is completed in the coating block 300a is carried in the exposure apparatus 700. Optionally, the additional process chamber 520 may perform a predetermined additional process before the substrate W of which process is completed in the exposure apparatus 700 is carried into the developing block 300b. According to an example, the additional process may be an edge exposure process of exposing the edge region of the substrate W, a top surface cleaning process of cleaning the top surface of the substrate W, or a bottom surface cleaning process of cleaning the bottom surface of the substrate W. A plurality of additional process chambers 520 may be provided and provided to be laminated on each other. All of the additional process chambers 520 may be provided to perform the same process. Optionally, some of the additional process chambers 520 may be provided to perform different processes.

The interface buffer 530 provides a space in which the substrate W transferred among the coating block 300a, the additional process chamber 520, the exposure apparatus 700, and the developing block 300b temporarily stays in the middle of the transfer. A plurality of interface buffers 530 may be provided and the plurality of interface buffers 530 may be provided to be laminated on each other.

According to an example, the additional process chamber 520 may be arranged on one side surface based on an extension line of the longitudinal direction of the transfer chamber 350, and the interface buffer 530 may be arranged on the other side surface.

The interface robot 550 transfers the substrate W among the coating block 300a, the additional process chamber 520, the exposure apparatus 700, and the developing block 300b. The interface robot 550 may have a transfer hand that transfers the substrate W. The interface robot 550 may be provided as one or a plurality of robots. According to an example, the interface robot 550 has a first robot 552 and a second robot 554. The first robot 552 may be provided to transfer the substrate W among the coating block 300a, the additional process chamber 520, and the interface buffer 530, the second robot 554 may be provided to transfer the substrate W between the interface buffer 530 and the exposure apparatus 700, and the second robot 554 may be provided to transfer the substrate W between the interface buffer 530 and the developing block 300b.

Each of the first robot 552 and the second robot 554 may include a transfer hand on which the substrate W is placed, and the hand may be provided to be movable forward and backward, rotatable based on an axis parallel to the third direction 16, and movable in the third direction 16.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. An apparatus for treating a substrate, the apparatus comprising:
a first substrate treating apparatus configured to perform a coating process of forming a film on a substrate;
a transfer system including a transfer robot configured to transfer a substrate once the coating process is terminated; and
a controller configured to control the first substrate treating apparatus and the transfer system to rotate the substrate at a first rotational velocity, once the coating process is terminated, until the substrate is transferred by the transfer system
the controller being configured to control rotation of the substrate at the first rotational velocity to be stopped when the transfer robot is located at a set position, and
the first substrate treating apparatus including a process chamber defining an inner space in which the coating process is performed, and having a door configured to allow the substrate to be carried in and over on one side wall, and
the set position being a position where the transfer robot is positioned in front of the door.

2. The apparatus for treating a substrate of claim 1, wherein the controller is configured to control the first substrate treating apparatus to
form a film on the substrate by supplying a first liquid to the rotating substrate using a liquid supply, and
remove a first portion of the film on an edge region of the substrate by supplying a second liquid to the rotating substrate, and
rotate the substrate at a second rotational velocity during the forming of the film and rotate the substrate at a third rotational velocity during the removing of the first portion of the film.

3. The apparatus for treating a substrate of claim 2, wherein the controller is configured to control the first rotational velocity to be lower than the third rotational velocity.

4. The apparatus for treating a substrate of claim 3, wherein the controller is configured to control the third rotational velocity to be lower than the second rotational velocity.

5. The apparatus for treating a substrate of claim 1, wherein the first rotational velocity is 10 rpm to 20 rpm.

6. The apparatus for treating a substrate of claim 2, wherein the first liquid includes a photosensitive liquid, and the second liquid includes a thinner.

7. The apparatus for treating a substrate of claim 1, wherein the first substrate treating apparatus includes a process chamber defining an inner space, a liquid treating system in the inner space and configured to perform a liquid treating process, and an air flow supply, disposed above the process chamber, configured to provide an air flow to the inner space, and the liquid treating system including a treating container that defines a treating space, a support configured to support and rotate the substrate in the treating space, and a liquid supply configured to supply a treating liquid to the substrate supported on the support.

8. The apparatus for treating a substrate of claim 1, further comprising:

a second substrate treating apparatus configured to perform a heat treating process on the substrate, wherein the transfer system transfers the substrate between the first substrate treating apparatus and the second substrate treating apparatus.

9. An apparatus for treating a substrate, the apparatus comprising:

a first substrate treating apparatus configured to perform a coating process of forming a film on a rotating substrate;

a second substrate treating apparatus configured to perform a heat treating process on the substrate;

a transfer system including a transfer robot configured to transfer the substrate between the first substrate treating apparatus and the second substrate treating apparatus; and a controller configured to control the first substrate treating apparatus, the second substrate treating apparatus, and the transfer system to rotate the substrate at a first rotational velocity, once the the coating process is terminated, until the substrate is transferred by the transfer system and the transfer robot is located at a set position the controller being configured to control the coating process to form the film on the substrate by supplying a photosensitive liquid to a substrate that rotates at a second rotational velocity, and remove a first portion of a film of an edge region of the substrate by supplying a thinner liquid to the substrate that rotates at a third rotational velocity, and the first rotational velocity being lower than the third rotational velocity, and the third rotational velocity being lower than the second rotational velocity, and the set position being a position where the transfer robot is positioned in front of a door of a process chamber in which the coating process is performed.

* * * * *